United States Patent
Segervall

(10) Patent No.: US 7,215,147 B1
(45) Date of Patent: May 8, 2007

(54) SYSTEM AND METHOD FOR PROVIDING POWER MANAGED CML TRANSMITTERS FOR USE WITH MAIN AND AUXILIARY POWER SOURCES

(75) Inventor: Alan E. Segervall, Silver Moon Bay, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 189 days.

(21) Appl. No.: 11/009,494

(22) Filed: Dec. 10, 2004

(51) Int. Cl.
*H03K 19/0175* (2006.01)

(52) U.S. Cl. .......................... 326/83; 326/81; 327/534

(58) Field of Classification Search ............ 326/80–86, 326/112, 115; 327/534, 535
See application file for complete search history.

(56) References Cited

U.S. PATENT DOCUMENTS

| | | | |
|---|---|---|---|
| 5,153,853 A * | 10/1992 | Eby et al. .............. | 365/185.08 |
| 5,559,464 A * | 9/1996 | Orii et al. .................... | 327/333 |
| 6,545,525 B2 * | 4/2003 | Itoh et al. ................... | 327/524 |
| 6,556,071 B2 * | 4/2003 | Notani et al. ............... | 327/544 |
| 6,833,748 B2 * | 12/2004 | Cho ........................... | 327/374 |
| 6,954,110 B2 * | 10/2005 | Li ............................... | 331/57 |
| 2004/0246026 A1 * | 12/2004 | Wang et al. .................. | 326/86 |

\* cited by examiner

*Primary Examiner*—Don Le

(57) ABSTRACT

A system and method is provided for providing power managed common mode logic (CML) transmitters for use with main and auxiliary power sources. Power switch circuitry comprising two PMOS transistors switches the CML transmitter output circuit between a main power source node (VDD) and an auxiliary power source node (TXRAIL). A bias circuit biases the two PMOS transistors to place the main power source voltage on the auxiliary power source node (TXRAIL) when the value of the main power source voltage is nonzero. The bias circuit also biases the two PMOS transistors to remain off when the value of the main power source voltage on the main power source node (VDD) is zero.

21 Claims, 3 Drawing Sheets

US 7,215,147 B1

SYSTEM AND METHOD FOR PROVIDING POWER MANAGED CML TRANSMITTERS FOR USE WITH MAIN AND AUXILIARY POWER SOURCES

TECHNICAL FIELD OF THE INVENTION

The present invention is generally directed to common mode logic (CML) transmitters and, in particular, to a system and method for providing power managed CML transmitters for use with main and auxiliary power sources.

BACKGROUND OF THE INVENTION

One advantage of common mode logic (CML) transmitters is that they operate at high speeds. One disadvantage, however, is that CML transmitters continuously burn current. In some CML transmitter applications power saving measures are employed to reduce the power consumption that is required to continuously provide current. In such instances the main power source of the CML transmitter is switched off and an auxiliary power source is switched on when the CML transmitter is placed into a power conservation state.

PCIExpress is a well known serial bus interface standard. One of the PCIExpress power conservation states is referred to as a P2 state. Assume that a CML transmitter has been placed in a PCIExpress P2 state and is operating on an auxiliary power source. Some level of functionality in the CML transmitter must still be maintained in order for the CML transmitter to operate properly. For example, the CML transmitter must operate in a P2 Beacon mode in order to indicate the existence of a valid serial connection. In a P2 Beacon mode the CML transmitter needs to switch to a separate regulated power supply.

There is a need in the art for an improved system and method for providing power managed CML transmitters for use with main and auxiliary power sources. There is also a need in the art for an improved system and method for switching between a main power source for a CML transmitter and an auxiliary power source for the CML transmitter.

SUMMARY OF THE INVENTION

To address the above-discussed deficiencies of the prior art, it is a primary object of the present invention to provide an improved system and method for operating power managed CML transmitters that operate on both main and auxiliary power sources.

In one advantageous embodiment the present invention provides a CML transmitter output switch circuit having power switch circuitry that is capable of switching the CML transmitter output circuit between a main power source node (VDD) and an auxiliary power source node (TXRAIL). In one advantageous embodiment the power switch circuit comprises two PMOS transistors.

In one advantageous embodiment the invention also comprises a bias circuit that is coupled to the CML transmitter output circuit. The bias circuit biases the two PMOS transistors to place the main power source voltage (VDD) on the auxiliary power source node (TXRAIL) when the value of the main power source voltage is nonzero. The bias circuit also biases the two PMOS transistors to remain off when the value of the main power source voltage is zero. This prevents the two PMOS transistors from MOS conducting from the auxiliary power source node (TXRAIL) to the main power source node (VDD) when the main power source voltage is zero.

It is an object of the present invention to provide a system and method for providing power managed CML transmitters for use with main and auxiliary power sources.

It is also an object of the present invention to provide a system and method for switching between a main power source for a CML transmitter and an auxiliary power source for the CML transmitter.

It is yet another object of the present invention to provide a system and method for providing a power switch bias circuit for biasing power switch circuitry within a CML transmitter.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
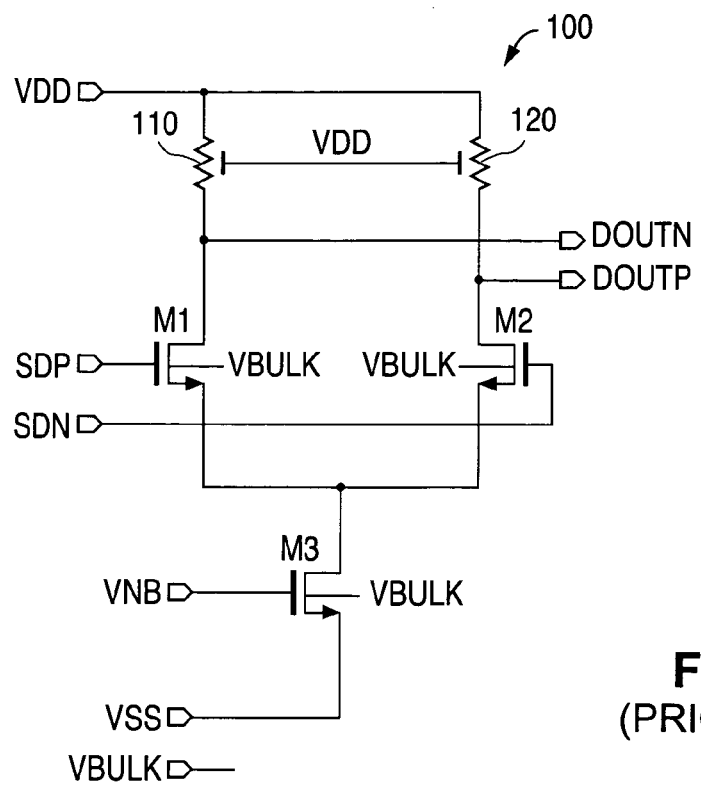
FIG. 1 illustrates a schematic diagram of a prior art CML transmitter.

FIGS. 1 through 4 and the various embodiments used to describe the principles of the present invention in this patent document are by way of illustration only and should not be construed in any way to limit the scope of the invention. Those skilled in the art will understand that the principles of the present invention may be implemented in any type of suitably arranged common mode logic (CML) transmitter circuit.

To simplify the drawings the reference numerals from previous drawings will sometimes not be repeated for structures that have already been identified.

In order to better understand the principles of the present invention a description of a prior art current mode logic (CML) transmitter output circuit will first be given. FIG. 1 illustrates a schematic diagram of a prior art current mode logic (CML) transmitter output circuit 100. The current mode logic (CML) transmitter output circuit 100 comprises resistor 110, resistor 120, NMOS transistor M1, NMOS transistor M2 and NMOS transistor M3 coupled together as shown in FIG. 1. Supply voltage VDD is provided to a first end of resistor 110 and to a first end of resistor 120. The drain of NMOS transistor M1 is coupled to a second end of resistor 110 and to the output node DOUTN. The drain of NMOS transistor M2 is coupled to a second end of resistor 120 and to the output node DOUTP.

The gate of NMOS transistor M1 is coupled to a first input signal SDP. The gate of NMOS transistor M2 is coupled to a second input signal SDN. The source of NMOS transistor M1 and the source of NMOS transistor M2 are each coupled to the drain of bias NMOS transistor M3. The source of bias NMOS transistor M3 is coupled to the ground voltage VSS. The gate of NMOS bias transistor M3 is coupled to a bias control voltage signal VNB.

The inputs SDP and SDN of circuit 100 are differential inputs. When the SDP is signal is high the SDN signal is low. Conversely, when the SDP signal is low the SDN signal is high. In one commonly used configuration the high level signal has a value of one and eight tenths volts (1.8 V) and the low level signal has a value of one and four tenths volts (1.4 V).

The outputs DOUTN and DOUTP of circuit 100 are differential outputs. The outputs DOUTN and DOUTP typically have an output level that has a magnitude of four hundred millivolts (400 mV). The magnitude of the output level at the outputs DOUTN and DOUTP is set by the reference tail current through NMOS bias transistor M3 and the voltage drop across resistors 110 and 120. The output voltages at DOUTN and DOUTP are controlled by providing control signals to the gates of NMOS transistor M1 and NMOS transistor M2. In the prior art circuit 100 shown in FIG. 1 the only power source is the supply voltage VDD.

Figure 2:
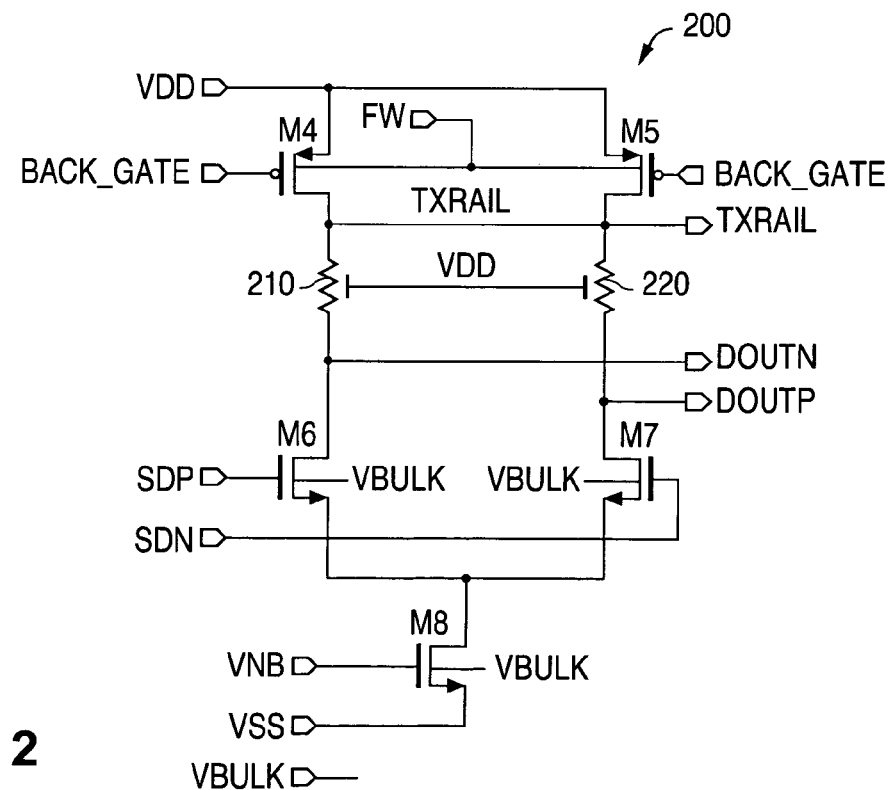
FIG. 2 illustrates a schematic diagram of a CML transmitter constructed in accordance with the principles of the present invention.

FIG. 2 illustrates a schematic diagram of a CML transmitter output circuit 200 constructed in accordance with the principles of the present invention. As shown in FIG. 2, the CML transmitter output circuit 200 comprises PMOS transistor M4, resistor 210, PMOS transistor M5, resistor 220, NMOS transistor M6, NMOS transistor M7 and NMOS transistor M8 coupled together as shown in FIG. 2. Main power source VDD is coupled to the source of PMOS transistor M4 and to the source of PMOS transistor M5.

The drain of PMOS transistor M4 is coupled to a first end of resistor 210 and to a TXRAIL node. The drain of PMOS transistor M5 is coupled to a first end of resistor 220 and to the TXRAIL node. The gate of PMOS transistor M4 and the gate of PMOS transistor M5 are coupled to a BACK_GATE node. The nwell of the PNOS transistor M4 and the nwell of PMOS transistor M5 are each coupled to a FW node ("Floating Well" node) instead of being coupled to the main power source VDD.

The second end of resistor 210 is coupled to the output node DOUTN and to the drain of NMOS transistor M6. The second end of resistor 220 is coupled to the output node DOUTP and to the drain of NMOS transistor M7.

The gate of NMOS transistor M6 is coupled to a first input signal SDP. The gate of NMOS transistor M7 is coupled to a second input signal SDN. The source of NMOS transistor M6 and the source of NMOS transistor M7 are each coupled to the drain of NMOS bias transistor M8. The source of NMOS bias transistor M8 is coupled to the ground voltage VSS. The gate of NMOS bias transistor M8 is coupled to a bias control voltage signal VNB.

The main power source is coupled to the VDD node. In one advantageous embodiment the main power source is one and eight tenths volts (1.8 V). PMOS transistor M4 and PMOS transistor M5 comprise a PMOS switch device (M4, M5) for switching between the main power source and an auxiliary power source. As previously mentioned the nwell of the PNOS transistor M4 and the nwell of PMOS transistor M5 are each coupled to a FW node.

The TXRAIL node (to which the sources of PMOS transistor M4 and PMOS transistor M5 are coupled) acts as a virtual supply point. The TXRAIL node is also coupled to the output of a regulator (not shown) that runs off of the auxiliary power source. In one advantageous embodiment the auxiliary power source is three and three tenths volts (3.3 V). The regulator that is running off of the auxiliary power source is disabled when the main power source is turned on.

The TXRAIL node is coupled to a first end of resistor 210. The TXRAIL node is also coupled to a first end of resistor 220. In one advantageous embodiment the two resistors 210 and 220 each have a resistance of fifty ohms (50Ω). The first end of resistor 210 is coupled to the drain of PMOS transistor M4 and the second end of resistor 210 is coupled to the drain of NMOS transistor M6. The first end of resistor 220 is coupled to the drain of PMOS transistor M5 and the second end of resistor 220 is coupled to the drain of NMOS transistor M7.

The gate of NMOS transistor M6 and the gate of NMOS transistor M7 are each driven respectively by the input signals SDP and SDN from a CML predrive stage (not shown). NMOS bias transistor M8 provides the bias tail current.

PMOS transistor M4 and PMOS transistor M4 comprise a PMOS switch device in CML transmitter output circuit 200 for switching between the main power source at VDD and a regulated auxiliary power source at the TXRAIL node. Assume that the main power source VDD is powered down. Then the TXRAIL node receives power from the output of a regulator (not shown) that runs off of the auxiliary power source (not shown). The parasitic P+/N−diode formed by the drain of PMOS transistor M4 and the drain of PMOS transistor M5 would then forward bias to VDD (at ground potential). In addition, the gate of PMOS transistor M4 and the gate of PMOS transistor M5 (when driven by control logic from the now powered down main power source VDD)

would be at ground potential. Therefore, the PMOS switch device (comprising M4 and M5) would turn on and MOS conduct to ground.

Figure 3:
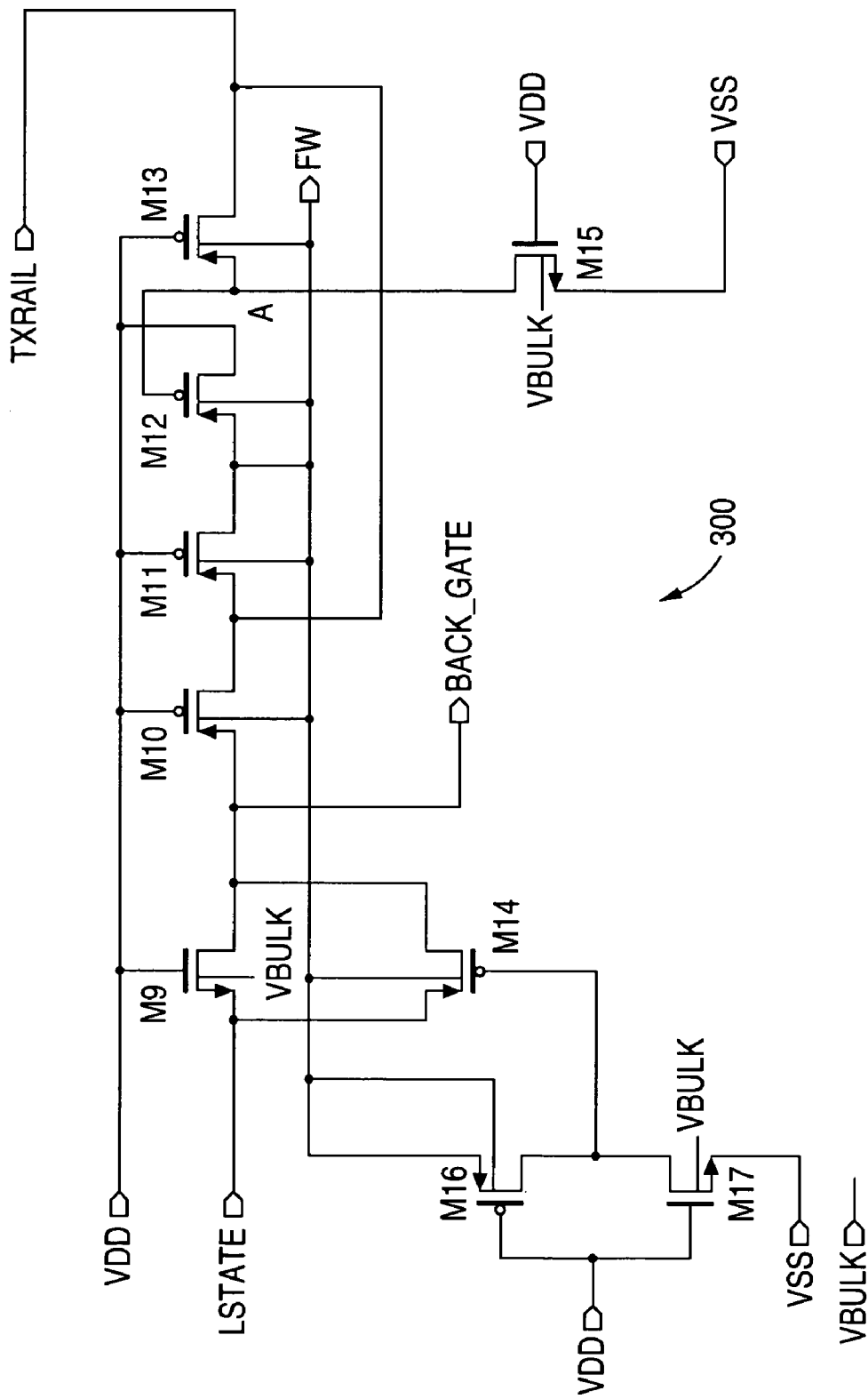
FIG. 3 illustrates a schematic diagram of a bias circuit of the present invention for use with the CML transmitter of the present invention shown in FIG. 2.

It is desirable to eliminate this effect when the main power source VDD of CML transmitter output circuit 200 is off and CML transmitter output circuit 200 is operating on the auxiliary power source at TXRAIL. This is where the bias circuit 300 shown in FIG. 3 comes in. FIG. 3 illustrates a schematic diagram of a bias circuit 300 of the present invention. Bias circuit 300 biases the FW node to the greater of the two potentials VDD or TXRAIL. Bias circuit 300 comprises six PMOS transistors (M10, M11, M12, M13, M14, M16) and three NMOS transistors (M9, M15, M17) coupled together as shown in FIG. 3.

The gates of NMOS transistor M9, PMOS transistor M10, PMOS transistor M11, and PMOS transistor M13 are coupled to the main power source VDD. The drain of PMOS transistor M12 is also coupled to the main power source VDD. The gate of PMOS transistor M12 and the source of PMOS transistor M13 are both coupled to Node A. Node A is also coupled to the drain of NMOS transistor M15. The source of NMOS transistor M15 is coupled to the ground voltage VSS. The gate of NMOS transistor M15 is coupled to the main power source VDD.

The drain of PMOS transistor M10 and the source of PMOS transistor M11 and the drain of PMOS transistor M13 are coupled to the TXRAIL node. The drain of PMOS transistor M11 and the source of PMOS transistor M12 are coupled to the FW node. The nwells of PMOS transistors M10, M11, M12 and M13 are also coupled to the FW node. The drain of NMOS transistor M9 and the source of PMOS transistor M10 are coupled to the BACK_GATE node. As previously mentioned, the BACK_GATE node is coupled to the gate of PMOS transistor M4 and to the gate of PMOS transistor M5 shown in FIG. 2.

The source of NMOS transistor M9 is coupled to an LSTATE control node and to the source of PMOS transistor M14. The drain of NMOS transistor M9 is coupled to the drain of PMOS transistor M14. The nwell of PMOS transistor M14 is coupled to the FW node.

The main power source VDD is coupled to the gate of PMOS transistor M16 and to the gate of NMOS transistor M17. PMOS transistor M16 and NMOS transistor M17 are coupled together in an inverter configuration. The source and nwell of PMOS transistor M16 is coupled to the FW node. The drain of PMOS transistor M16 and the drain of NMOS transistor M17 are each coupled to the gate of PMOS transistor M14. The source of NMOS transistor M17 is coupled to ground voltage VSS.

When the main power source VDD is activated and the VDD voltage (e.g., 1.8 volts) is present, the BACK_GATE node drives the voltage from the control node LSTATE to the gates of the PMOS switch transistors (PMOS transistor M4 and PMOS transistor M5) shown in FIG. 2. When the main power source VDD is powered down to a zero value, then the BACK_GATE node is driven to the voltage that is present on the TXRAIL node. This controls the gates of the PMOS switch transistors (PMOS transistor M4 and PMOS transistor M5) so that they remain off (e.g., in the power managed P2 state) when the value of the main power source voltage VDD is zero.

In order to better understand the principles of the present invention some examples of the operation of CML transmitter output circuit 200 and bias switch 300 will now be given. Assume (1) that the main power source is powered up and that VDD is equal to 1.8 volts, and (2) that the regulator for generating a voltage level of 1.8 volts from the auxiliary power source of 3.3 volts is disabled. This case represents the active mode in which the CML transmitter output circuit 200 is operating with the voltage from the 1.8 volt main power source.

Referring to FIG. 3, one sees that the BACK_GATE node is driven by the control node LSTATE through a transfer gate that comprises NMOS transistor M9 and PMOS transistor M14. This transfer gate (M9, M14) is enabled by the main power source voltage VDD. When a control signal on the control node LSTATE is low, then the signal at the BACK_GATE node is also low. The low signal on the BACK_GATE node enables the PMOS switch transistors (PMOS transistor M4 and PMOS transistor M5) shown in FIG. 2. This puts the 1.8 volt main power source VDD voltage on the TXRAIL node acting as a virtual power supply for the CML transmitter output circuit 200.

The FW node represents the "floating well" of the PMOS switch transistors (M4 and M5). The FW node is powered by the main power source VDD through PMOS transistor M12 when the main power source VDD is on. The gate of PMOS transistor M12 is controlled by NMOS transistor M15. NMOS transistor M15 grounds the gate of PMOS transistor M12 when the main power source VDD is on. At the same time the PMOS transistor M13 is switched off by NMOS transistor M15 when the main power source VDD is on. Switching off PMOS transistor M13 isolates Node A from the voltage on the TXRAIL node.

Now consider the case in which (1) that the main power source is powered down and that VDD is equal to zero volts, and (2) that the regulator for generating a voltage level of 1.8 volts from the auxiliary power source of 3.3 volts is enabled. This case represents the "power down" mode in which the Beacon mode of the CML transmitter output circuit 200 is operating with the 1.8 volt regulated power supply coming from the 3.3 volt auxiliary power source. In this case the gates of the PMOS switches (M4 and M5) need to be provided a high signal (i.e., an "off" signal) by the BACK_GATE node. In addition, the nwells (at the FW node) of the PMOS switches (M4 and M5) need to be biased up to the regulated output voltage on the TXRAIL node.

Referring to FIG. 3, one sees that when the main power source VDD is powered down to zero volts, the control signal on the LSTATE control node is blocked by the transfer gate (NMOS transistor M9 and PMOS transistor M14) that is controlled by the VDD voltage. The signal on the BACK_GATE node is now set high because PMOS transistor M10 is on and the voltage on the TXRAIL node propagates through.

This turns off the PMOS switches (M4 and M5) so that they do not MOS conduct from the regulated 1.8 volt TXRAIL to the main power source VDD zero voltage. The FW node is biased by the regulated 1.8 volts on the TXRAIL node through PMOS transistor M11. PMOS transistor M13 is also on. This puts the TXRAIL voltage on Node A. The presence of the TXRAIL voltage on Node A switches off PMOS transistor M12. Switching off PMOS transistor M12 isolates the FW node from the zero voltage value of main power source VDD.

Figure 4:
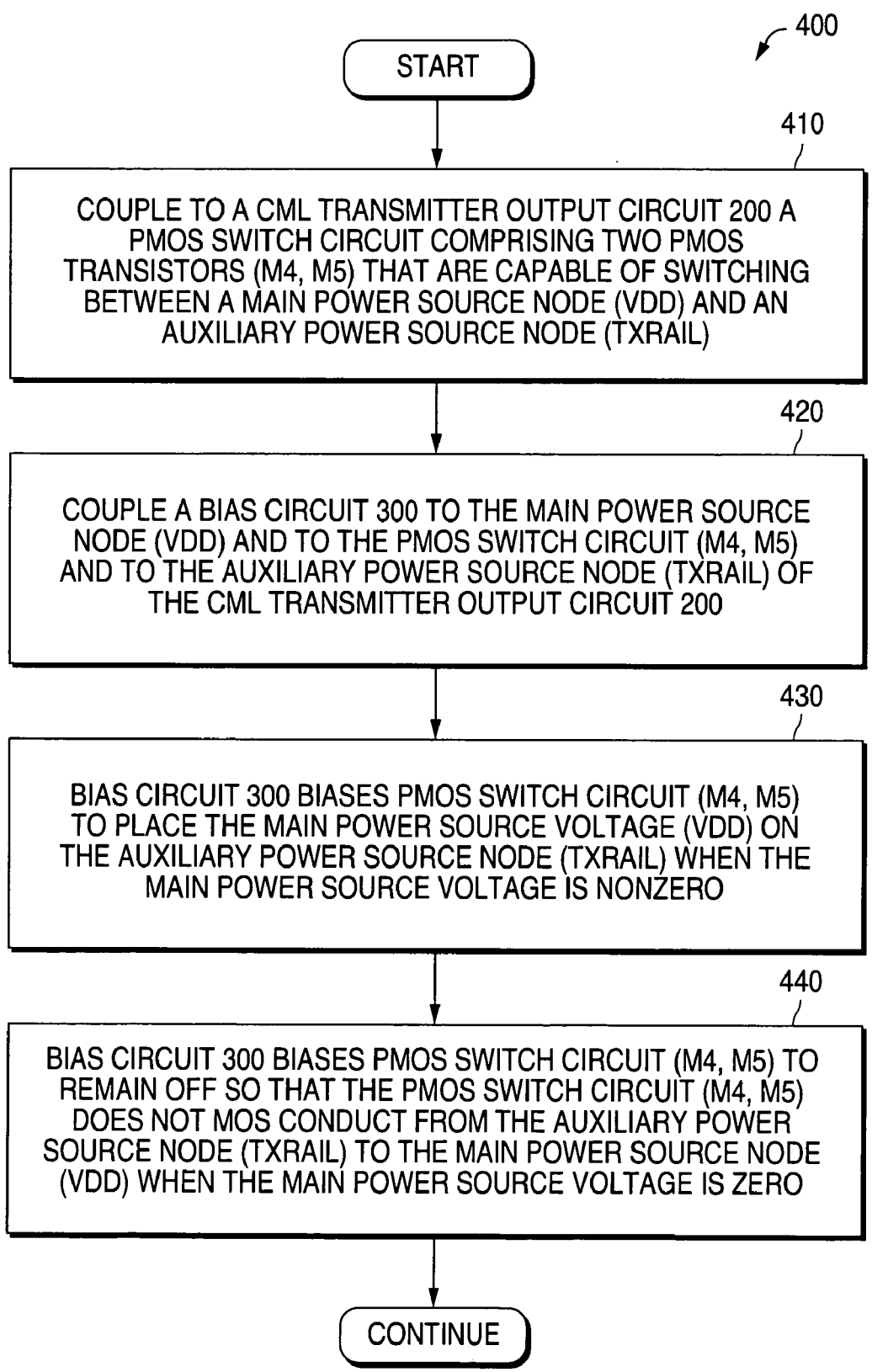
FIG. 4 illustrates a flowchart showing the steps of an advantageous embodiment of the method of the present invention.

FIG. 4 illustrates a flowchart 400 showing the steps of an advantageous embodiment of the method of the present invention. In the first step a PMOS switch circuit comprising two PMOS transistors (M4, M5) is coupled to a CML transmitter output circuit 200. The PMOS switch circuit is capable of switching between a main power source node (VDD) and an auxiliary power source node (TXRAIL) of the CML transmitter output circuit 200 (step 410). Then a bias circuit 300 is coupled to the main power source node (VDD) and to the PMOS switch circuit (M4, M5) and to the auxiliary power source node (TXRAIL) (step 420).

The bias circuit 300 biases the PMOS switch circuit (M4, M5) to place the main power source voltage (VDD) on the auxiliary power source node (TXRAIL) when the main power source voltage is nonzero (step 430). The bias circuit 300 also biases the PMOS switch circuit (M4, M5) to remain off so that the PMOS switch circuit (M4, M5) does not MOS conduct from the auxiliary power source node (TXRAIL) to the main power source node (VDD) when the main power source voltage is zero (step 440).

The CML transmitter output circuit 200 and the bias circuit 300 of the present invention provide improved circuitry for managing the power supply of CML transmitters. The present invention provides a CML transmitter (1) that can run on a standard main power source VDD during normal operations, and (2) that can also run off a regulated power supply (from an auxiliary power source) when the normal main power source VDD is shut off. The present invention can be used in any CML transmitter application where there is a need to run off more than one power supply.

An advantageous embodiment of the invention has been described in which a PMOS switch has been utilized in CML transmitter output circuit 200. Persons who are skilled in the art will understand that the advantageous embodiment that has been described is an exemplary embodiment of the invention and that other equivalent types of circuitry may also be used to practice the invention.

Although the present invention has been described with an exemplary embodiment, various changes and modifications may be suggested to one skilled in the art. It is intended that the present invention encompass such changes and modifications as fall within the scope of the appended claims.

What is claimed is:

1. A switch circuit capable of switching a common mode logic transmitter output circuit between power source nodes, said switch circuit comprising:
   a main power source node;
   an auxiliary power source node;
   a first PMOS transistor having a source coupled to said main power source node and a drain coupled to said auxiliary power source node;
   a second PMOS transistor having a source coupled to said main power source node and a drain coupled to said auxiliary power source node;
   a floating well node coupled to an nwell of said first PMOS transistor and to an nwell of said second PMOS transistor; and
   a back gate node coupled to a gate of said first PMOS transistor and to a gate of said second PMOS transistor.

2. The switch circuit as set forth in claim 1 further comprising a bias circuit, wherein said bias circuit comprises:
   a first input coupled to said main power source node;
   a second input coupled to said auxiliary power source node;
   a third input coupled to a control signal node;
   a first output coupled to said floating well node; and
   a second output coupled to said back gate node.

3. The switch circuit as set forth in claim 2 wherein said bias circuit biases said switch circuit to place a main power source voltage on said auxiliary power source node when said main power source voltage has a non-zero value.

4. The switch circuit as set forth in claim 2 wherein said bias circuit biases said switch circuit to remain off when a main power source voltage on said main power source node has a zero value.

5. The switch circuit as set forth in claim 4 wherein said switch circuit does not MOS conduct from said auxiliary power source node to said main power source node when said main power source voltage on said main power source node has a zero value.

6. The switch circuit as set forth in claim 2 wherein said bias circuit biases said floating well node to a greater value of one of: a voltage potential on said main power source node and a voltage potential on said auxiliary power source node.

7. The switch circuit as set forth in claim 2 wherein said bias circuit drives a control signal that is present on said control signal node to said back gate node when said main power source voltage on said main power source node has a non-zero value.

8. The switch circuit as set forth in claim 7 wherein said control signal on said back gate node enables said first PMOS transistor and said second PMOS transistor to place said main power source voltage on said auxiliary power node as a virtual power supply for said common mode logic transmitter output circuit.

9. The switch circuit as set forth in claim 7 wherein said bias circuit comprises a transfer gate having an input coupled to said control signal node and an output coupled to said back gate node.

10. The switch circuit as set forth in claim 9 wherein said transfer gate comprises an NMOS transistor and a PMOS transistor that are enabled by said main power source voltage.

11. The switch circuit as set forth in claim 2 wherein said bias circuit drives to said back gate node a voltage that is present on said auxiliary power node when said main power source voltage on said main power source node has a zero value.

12. The switch circuit as set forth in claim 11 wherein said voltage on said back gate node provides a high signal to said gate of said first PMOS transistor and to said gate of said second PMOS transistor to turn off said first PMOS transistor and said second PMOS transistor when said main power source voltage on said main power source node has a zero value.

13. The switch circuit as set forth in claim 12 wherein said bias circuit biases said floating well node to a value of voltage that is present on said auxiliary power source node.

14. The switch circuit as set forth in claim 13 wherein said value of voltage that is present on said auxiliary power source node is approximately one and eight tenths volts.

15. A method of switching a common mode logic transmitter output circuit between power source nodes node, said method comprising the steps of:
   coupling a source of a first PMOS transistor to a main power source node;
   coupling a drain of said first PMOS transistor to an auxiliary power source node;
   coupling a source of a second PMOS transistor to said main power source node;
   coupling a drain of said second PMOS transistor to said auxiliary power source node;
   coupling a floating well node to an nwell of said first PMOS transistor and to an nwell of said second PMOS transistor; and
   coupling a back gate node to a gate of said first PMOS transistor and to a gate of said second PMOS transistor.

16. The method as set forth in claim 15 further comprising the steps of:
- coupling a first input of a bias circuit to said main power source node;
- coupling a second input of said bias circuit to said auxiliary power source node;
- coupling a third input of said bias circuit to a control signal node;
- coupling a first output of said bias circuit to said floating well node; and
- coupling a second output of said bias circuit to said back gate node.

17. The method as set forth in claim 16 further comprising the step of:
- biasing said first PMOS transistor and said second PMOS transistor to place a main power source voltage on said auxiliary power source node when said main power source voltage has a non-zero value.

18. The method as set forth in claim 16 further comprising the step of:
- biasing said first PMOS transistor and said second PMOS transistor to remain off and not MOS conduct from said auxiliary power source node to said main power source node when said main power source voltage has a zero value.

19. An apparatus, comprising:
- a switch circuit comprising:
    - a first PMOS transistor having a source coupled to a main power source node and a drain coupled to an auxiliary power source node; and
    - a second PMOS transistor having a source coupled to the main power source node and a drain coupled to the auxiliary power source node; and
- a biasing circuit coupled to the first and second PMOS transistors and operable to (i) bias the switch circuit to place a main power source voltage on the auxiliary power source node when the main power source voltage has a first value and (ii) bias the switch circuit to remain off when the main power source voltage on the main power source node has a second value.

20. The apparatus of claim 19, wherein the switch circuit further comprises:
- a floating well node coupled to an nwell of the first PMOS transistor and to an nwell of the second PMOS transistor; and
- a back gate node coupled to a gate of the first PMOS transistor and to a gate of the second PMOS transistor.

21. The apparatus of claim 20, wherein the bias circuit comprises:
- a first input coupled to the main power source node;
- a second input coupled to the auxiliary power source node;
- a first output coupled to the floating well node; and
- a second output coupled to the back gate node.

* * * * *

UNITED STATES PATENT AND TRADEMARK OFFICE
CERTIFICATE OF CORRECTION

PATENT NO. : 7,215,147 B1 Page 1 of 1
APPLICATION NO. : 11/009494
DATED : May 8, 2007
INVENTOR(S) : Alan E. Segervall It is certified that error appears in the above-identified patent and that said Letters Patent is hereby corrected as shown below:

Column 8, claim 15, line 53, delete "node".

Signed and Sealed this

Fourteenth Day of August, 2007

JON W. DUDAS
*Director of the United States Patent and Trademark Office*